(12) United States Patent
Becker et al.

(10) Patent No.: US 6,186,873 B1
(45) Date of Patent: Feb. 13, 2001

(54) WAFER EDGE CLEANING

(75) Inventors: Kent R. Becker, Fairfax; Stuart D. Cheney, Essex Junction; Scott R. Cline, Enosburg Falls; Paul A. Manfredi, Waterbury Center; Eric J. White, Charlotte, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/550,079

(22) Filed: Apr. 14, 2000

(51) Int. Cl.⁷ ..................... B24B 1/00
(52) U.S. Cl. ............ 451/54; 451/55; 15/177
(58) Field of Search .............. 451/41, 63, 287, 451/288, 56, 218, 54, 55; 15/77, 88.2, 88.3, 21.1

(56) References Cited

U.S. PATENT DOCUMENTS

| | | | |
|---|---|---|---|
| 4,910,155 | 3/1990 | Cote et al. ................. | 437/8 |
| 5,729,856 * | 3/1998 | Jang et al. ................. | 15/88.1 |
| 5,894,622 | 4/1999 | Manfredi et al. ............ | 15/102 |
| 5,901,399 * | 5/1999 | Moinpour et al. ........... | 15/77 |
| 5,976,267 * | 11/1999 | Culkins et al. ............. | 134/6 |
| 6,092,253 * | 7/2000 | Moinpour et al. ........... | 15/77 |

FOREIGN PATENT DOCUMENTS

| | | |
|---|---|---|
| 6045302 * | 2/1994 | (JP) . |
| 6310481 * | 11/1994 | (JP) . |
| 9092600 * | 4/1997 | (JP) . |

* cited by examiner

Primary Examiner—Derris H. Banks
(74) Attorney, Agent, or Firm—Robert A. Walsh

(57) ABSTRACT

In a chemical mechanical polishing process for planarization of semiconductor wafers, a pair of opposed grippers are used to move the wafer from one station to another. During this movement, the wafer is rotated and brushes along the periphery are placed in contact with the edge of the wafer to remove foreign material and residue which builds up along the edge of the wafer. Cleaning fluid may be introduced to flush away and/or breakup the residue buildup.

14 Claims, 2 Drawing Sheets

WAFER EDGE CLEANING

FIELD OF THE INVENTION

This invention relates to semiconductor manufacturing equipment and more particularly to equipment used in the Chemical-Mechanical-Polishing(CMP) of semiconductor wafers and the cleaning of wafers following the basic polishing processes. More specifically this invention relates to wafer edge cleaning using brushes.

BACKGROUND OF THE INVENTION

In the polishing and cleaning of semiconductor wafers. there is known a certain type of brush cleaning tool which uses a pair of rotating sponge brushes as described in Gill, Jr.'s U.S. Pat. No. 5,144,711. Such a cleaning tool is offered commercially by Westech Systems as their model 3800 Automated Wafer Cleaner. Andros, U.S. Pat. No. 5,311,634 also teaches a form of rotary brush cleaner.

It is well known in the CMP technology to provide for the cleaning of semiconductor wafers following a CMP process, see for example Blackwell, U.S. Pat. No. 5,320,706 for a general teaching of the use of a cleaning process.

It is also well known to provide for the conditioning of a polishing pad insitu during the actual polishing process as evidenced by reference to Bombardier et al. U.S. Pat. No. 5,154,021 which teaches the conditioning of a polishing pad by the application of compressed air to the pad prior to its contact with the work piece and Prigge et al. U.S. Pat. No. 5,167,667 which teaches the application of a liquid for treating a polishing cloth following the completion of a polishing process.

The IBM Technical Disclosure Bulletin. "Water/Brush for Wafer Chem-Mech Polishing," Vol. 37 No. Mar. 03, 1994, p. 345, shows an insitu polishing and conditioner tool in which an air brush and hot water dispenser are placed on the polishing pad while the wafer/work piece is being polished.

In the processing of semiconductor wafers using a rotating brush tool of the Ebara type following the CMP Planarization of polysilicon filled trenches, residual particles were found to cause rejects of product due to the presence of foreign material (FM), and buildup of residual slurry material around the edge of the wafer.

SUMMARY OF THE INVENTION

Accordingly, it is an object of this invention to reduce the FM build up along the edges of semiconductor wafers after polishing the wafers while gripping and rotating the wafers during cleaning.

It is another object not to decrease the throughput of wafers cleaned after being polished by designing an insitu device.

These and other objects of the invention are achieved by the use of rollers and a brush which is placed along the edge of the wafer. The rotation and the pressure induced on said rollers, with the addition of a chemically treated brush, results in frictional contact in a manner such that FM on the edge surface is forcibly and chemically removed.

These and other aspects of the invention will become evident upon review of the more detailed description of the invention and its operation in connection with the accompanying drawings.

DESCRIPTION OF THE PREFERRED EMBODIMENT

While the present invention is described in terms of a single preferred embodiment, those skilled in the art will recognize that variations in the specific details of the present invention can be made within the spirit of the present invention.

Figure 1:
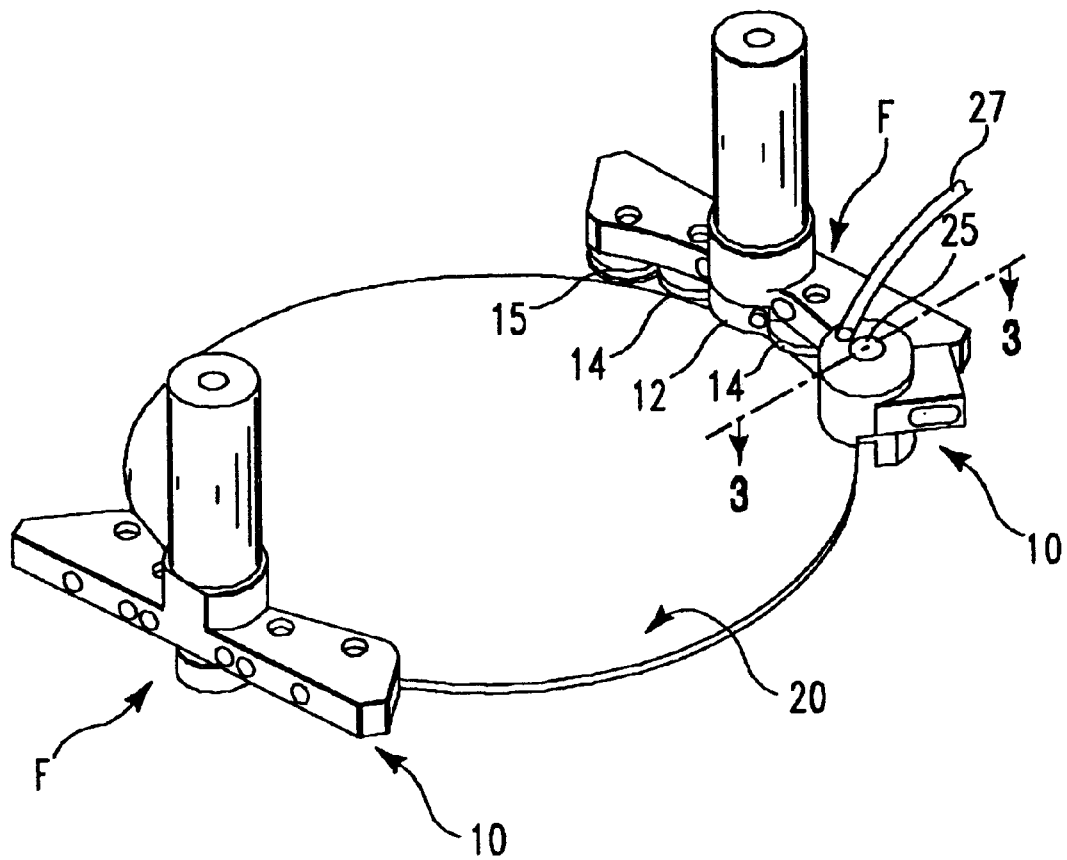
FIG. 1 is an isometric view of a cleaning tool showing the relative position of the edge cleaning assembly of the present invention to the semiconductor wafer and the rotating drive wheels and a fixed position non-rotating brush.
Figure 2:
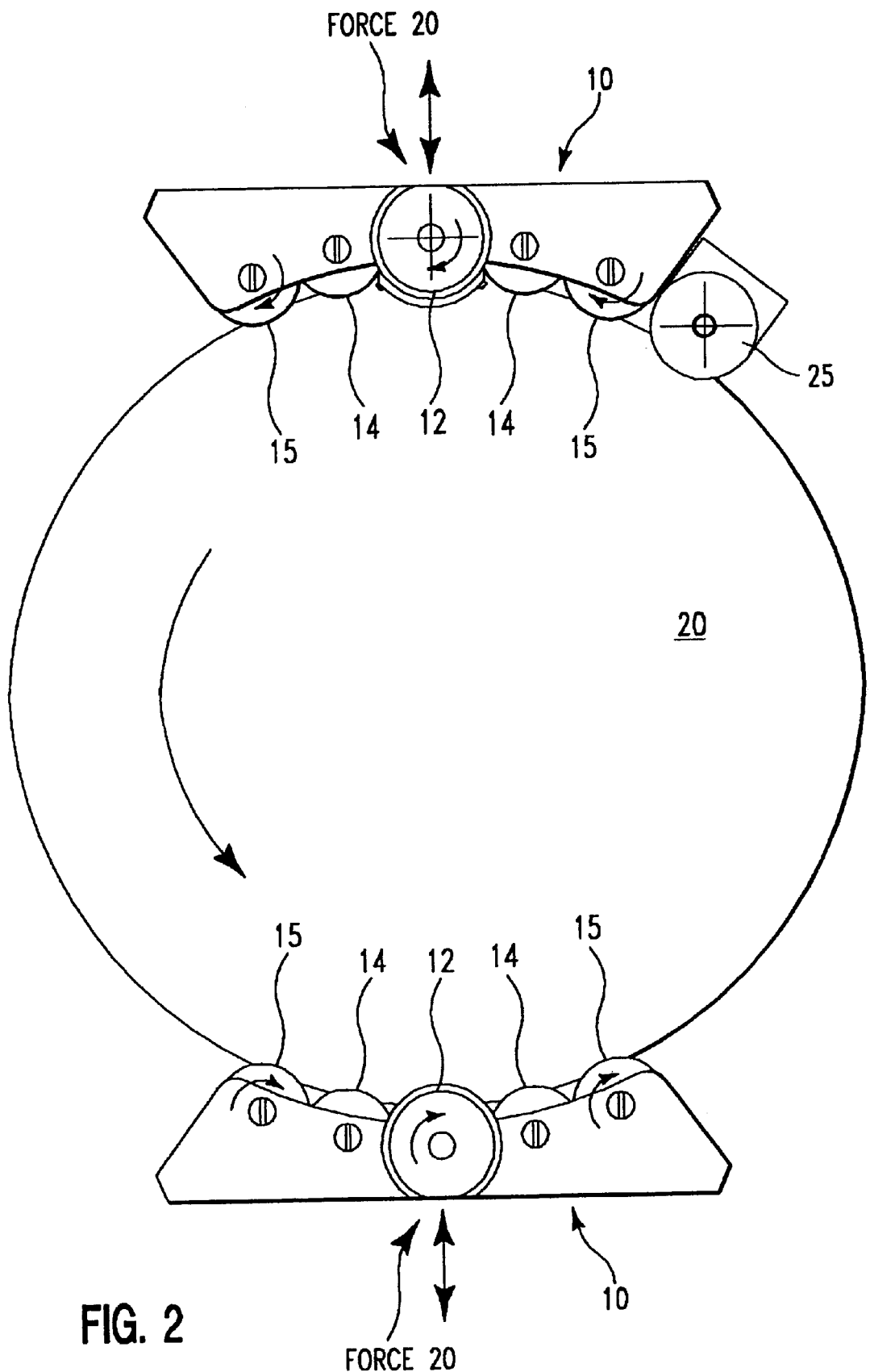
FIG. 2 is a plan view showing the position of the edge rotating rollers and fixed assembly brush holder of the present invention shown in FIG. 1.

FM and residue tend to buildup on and around the edge portion of a semiconductor wafer during the CMP process. It has been found that this buildup becomes solid and forms a ring like structure of residual slurry and FM around the periphery of the wafer which can cause severe defects in the further processing of the wafer if not removed. Referring to FIGS. 1 and 2, there is shown a pair of automated wafer gripper assemblies 10 positioned on opposite edges of a semiconductor wafer 20.

Such gripper assemblies are well known in the CMP processing for moving and transporting wafers. When closed on wafer 20 a force is applied inward. This force serves three purposes: 1) to grip the wafer; 2) to rotate the wafer; and 3) to apply sufficient pressure while the wafer is rotating. This pressure against the wafer is applied by three rotating wheels, one on each side of the wafer acts to abrade the surface of the wafer and reduce the buildup of residual slurry with which it comes into contact. This abrasion partially removes the residual slurry but more importantly enhances the performance of the cleaning assembly 25 (shown in more detail in FIG. 3) which surrounds the edge region of wafer 20. The cleaning assembly 25 includes a stationary brush 26 which is made of an absorbent, compliant material such as PVA which enables the brush 26, fixably mounted in the cleaning assembly 25, to conform and contact the area around the edge of wafer 20. Cleansing fluid, such as, water or oxalic acid, is supplied through tubing 27 from a pump and an external supply, not shown, whereby the brush 26 with cleansing fluid will have continuous contact with the wafer edge, during each revolution of wafer 20, for a period of time determined by the tools recipe.

Two idler gears 14 are located within each assembly 10. These gears are driven by motors (not shown) within the assembly 10 which act to drive the two outside bevel rollers 15. In order to effectively abrade the edge region of wafer 20. Three abrasive wheels are used; two of which are located on the bevel rollers 15 and one is on roller 12 within each assembly 10. It is understood that in some applications only one abrasive wheel may be required to abrade the edge region of the wafer. Further it is understood that the abrasive wheels may be positioned external to the assemblies and positioned along the periphery of the wafer. These wheels are preferably made of an abrasive thermal plastic material which facilitates the breakdown of slurry residuals and FM. This breakdown partially cleans wafer 20 edge; and, more importantly, helps to prepare the edge for the cleaning assembly 25 to remove the remaining residual slurry and FM.

As indicated above, the continuous breakdown of the surface residuals by rotation of wafer 20 through the abrasive wheels 15 and 12 and constant exposure to the brush 26 with its cleansing fluid removes all of the measurable quantities of the residual slurry and FM. As described, one of the gripper assembly 10 may carry the cleaning assembly 25. However, it may be envisioned that another cleaning assembly may be positioned on both gripper assemblies or external to both assemblies along the periphery of the wafer.

Figure 3:
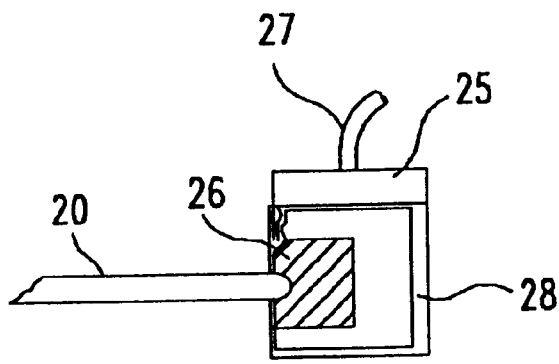
FIG. 3 is sectional view of the edge cleaning assembly of the present invention shown in FIG. 1 which shows the brush holder which provides cleansing fluid to the edge of the wafer while it is in use.

Referring briefly to FIG. 3, there is shown a cross section view with parts broken away of the cleaning assembly 25 illustrating a typical position of the edge cleaning brush 26 with respect to wafer 20. The cleaning assembly 25 includes an outer shell 28 which holds a pliable cleaning brush element 26. The shell has a portion facing the wafer cut away in order for wafer 20 to contact the brush element 26. The force of wafer 20 against the pliable brush element 26 makes the brush slightly compressed. While being compressed, the cleaning fluid supplied through tube 27 to the brush in low volumes through a pump, which is not shown, allowing the rotating wafer to wick away a small portion of the cleansing fluid. This wicking mechanism permits a sufficient retention time for the cleansing fluid to aid in the cleaning process as the wicked edge passes through the abrasive wheels 12 and 15. This combined effort of the abrasive wheels 12 and 15 along with the constant re-introduction of the abraded slurry from the rollers and then the brush action thoroughly cleans the edge region of wafer 20.

FIG. 2 is a plan view of the edge cleaning assembly and more clearly shows the brush holder and the brush mounted along the horizontal axis of the assembly. In operation, the edge cleaning assembly may be used at any time as wafers are being gripped and removed from one station to another during the CMP process. For example, after a wafer has been exposed to a slurry and polished, it may be taken from that station by the gripper assembly as described above. After the wafer is in the gripper assembly the abrasive wheels, brush and cleansing fluid contact the edges through its rotation within the gripper to remove the FM and residue which have built up during the polishing step.

While the present invention has been particularly shown and described with reference to a single preferred embodiment thereof, it will be understood by those skilled in the art the foregoing and other changes in form and details may be made without departing from the spirit and scope of the present invention.

What is claimed is:

1. An apparatus for cleaning an outer edge region of a semiconductor wafer comprising:
   a) a pair of wafer gripper assemblies having a leading, and a trailing region which is translatable to contact and grip the edge of the wafer;
   b) a clamper mechanism which brings all the regions into contact with the wafer;
   c) means for imparting relative rotational motion to the wafer by the pair of gripper assemblies; and
   d) a first abrasive element positioned near the trailing edge region of one of the assemblies to abrade the edge of the wafer.

2. The apparatus of claim 1, wherein said first abrasive element has two opposed surfaces, which are in contact with the edge of said wafer and thereby abrade the outer edge of the wafer.

3. The apparatus of claim 2, wherein one of the assemblies includes a second abrasive element near the leading region of one of the assemblies to abrade the edges of the wafer.

4. The apparatus of claim 3, wherein one of the assemblies includes a third abrasive element in one of the assemblies to abrade the edges of the wafer.

5. The apparatus of claim 1, wherein one of said assemblies includes a cleaning assembly with a stationary brush.

6. The apparatus of claim 5, wherein the cleaning assembly is located in the leading region of one of the gripper assemblies.

7. The apparatus of claim 6, wherein the cleaning assembly includes a shell container which supplies cleaning fluid to the brush.

8. The apparatus of claim 7, wherein the cleansing fluid is water.

9. The apparatus of claim 7, wherein the cleansing fluid is oxalic acid.

10. The apparatus of claim 5, wherein the brush is made of an absorbent, pliable material.

11. The apparatus of claim 1, wherein the first abrasive element is in the trailing region of both assemblies.

12. The apparatus of claim 1, wherein the means for imparting relative rotational motion is provided by a motor within each of the assemblies.

13. The apparatus of claim 1, wherein the abrasive element is made of thermal plastic material.

14. The apparatus of claim 1, wherein the abrasive element is a wheel.

* * * * *